(12) United States Patent
Purea et al.

(10) Patent No.: US 10,613,170 B2
(45) Date of Patent: Apr. 7, 2020

(54) NMR-MAS PROBEHEAD WITH AN OPTIMIZED MAS-DNP COIL BLOCK FOR FAST SAMPLE ROTATION

(71) Applicant: Bruker BioSpin GmbH, Rheinstetten (DE)

(72) Inventors: Armin Purea, Bad Schoenborn (DE); Christian Reiter, Bruchsal (DE); Alexandros I. Dimitriadis, Nyon (CH)

(73) Assignee: BRUKER BIOSPIN GMBH, Rheinstetten (DE)

( * ) Notice: Subject to any disclaimer, the term of this patent is extended or adjusted under 35 U.S.C. 154(b) by 0 days.

(21) Appl. No.: 16/369,536

(22) Filed: Mar. 29, 2019

(65) Prior Publication Data
US 2019/0302207 A1  Oct. 3, 2019

(30) Foreign Application Priority Data
Mar. 29, 2018  (DE) .................... 10 2018 204 913

(51) Int. Cl.
*G01R 33/46*  (2006.01)
*G01R 33/30*  (2006.01)
(Continued)

(52) U.S. Cl.
CPC ............ *G01R 33/46* (2013.01); *G01N 24/08* (2013.01); *G01R 1/067* (2013.01); *G01R 33/30* (2013.01); *G01R 33/307* (2013.01); *G01R 33/62* (2013.01)

(58) Field of Classification Search
CPC ...... G01R 33/46; G01R 33/307; G01R 33/30; G01R 33/62; G01R 33/4616; G01R 1/067; G01N 24/08
See application file for complete search history.

(56) References Cited

U.S. PATENT DOCUMENTS

| 10,120,044 B2 | 11/2018 | Purea et al. |
| 2013/0335079 A1* | 12/2013 | Samoson ............. G01R 33/307 |
| | | 324/309 |

(Continued)

FOREIGN PATENT DOCUMENTS

| DE | 102016207998 B3 | 9/2017 |
| EP | 3030917 A1 | 6/2016 |
| WO | 2015175507 A1 | 11/2015 |

OTHER PUBLICATIONS

A. Barnes et al., "Cryogenic sample exchange NMR probe for magic angle spinning dynamic nuclear polarization", Journal of Magnetic Resonance 198 (2009).

(Continued)

*Primary Examiner* — Rishi R Patel
(74) *Attorney, Agent, or Firm* — Edell, Shapiro & Finnan, LLC

(57) ABSTRACT

An NMR-MAS probehead having an MAS stator (3) receiving an MAS rotor (5) that is surrounded by an RF coil (4) and that has a sample substance, and having a first microwave guide (1) supplying microwave radiation into a sample volume (0) through a coil block (2). The coil block is constructed from dielectric material, is inserted into the wall of the MAS stator so that it surrounds the RF coil and the MAS rotor, and has a first bore (4') that extends coaxially with the longitudinal axis of the elongate MAS rotor, the RF coil being fastened to the inner wall of said first bore, as well as a second bore (8') that extends coaxially with the longitudinal axis of the first microwave guide and has a hollow, elongate second microwave guide (8) supplying microwave radiation from the first microwave guide into the sample volume.

18 Claims, 7 Drawing Sheets

(51) Int. Cl.
    *G01R 1/067*    (2006.01)
    *G01N 24/08*    (2006.01)
    *G01R 33/62*    (2006.01)

(56) References Cited

U.S. PATENT DOCUMENTS

| | | | |
|---|---|---|---|
| 2016/0195593 A1* | 7/2016 | Purea | G01R 33/282 324/322 |
| 2016/0334476 A1 | 11/2016 | Doty | |
| 2017/0074952 A1 | 3/2017 | Kantzas et al. | |
| 2018/0113183 A1 | 4/2018 | Purea et al. | |

OTHER PUBLICATIONS

Sergeyev et al., "Efficient 263 GHz magic angle spinning DNPat 100K using solid-state diode source", Solid State Nuclear Magnetic Resonance 100, 2019, pp. 63-69.
Barnes et al., "Dynamic nuclear polarization at 700 MHz / 460 GHz", Journal of Magnetic Resonance, 224, 2012, pp. 1-7.
Rosay et al., "Instrumentation for solid-state dynamic nuclear polarization with magic angle spinning NMR", Journal of Magnetic Resonance, 264, 2016, pp. 88-98.
European Search Report for EP counterpart application EP 19 16 5090 dated Jul. 18, 2019, with partial English Translation, 3 pages.

* cited by examiner

NMR-MAS PROBEHEAD WITH AN OPTIMIZED MAS-DNP COIL BLOCK FOR FAST SAMPLE ROTATION

CROSS REFERENCE TO RELATED APPLICATIONS

This application claims foreign priority under 35 U.S.C. § 119(a)-(d) to German Application No. 10 2018 204 913 filed on Mar. 29, 2018, the entire contents of which are hereby incorporated into the present application by reference.

FIELD OF THE INVENTION

The invention relates to an NMR-MAS probehead having an MAS stator for receiving an elongate MAS rotor that is surrounded by an RF coil, said MAS rotor having a sample substance in a sample volume, and having a hollow, elongate first microwave guide for supplying microwave radiation into the sample volume through a coil block introduced in a wall of the MAS stator, and a corresponding coil block.

BACKGROUND

Such an NMR-MAS probehead and the associated coil block are known from patent DE 10 2016 207 998 B3 (=reference [1]).

In general, the present invention relates to the field of magnetic resonance (MR). Nuclear magnetic resonance (NMR) spectroscopy is a commercially widespread method in MR for characterizing the chemical composition of substances. In MR, the measurement sample which is situated in a strong static magnetic field is generally irradiated by radiofrequency (RF) pulses and the electromagnetic reaction of the sample is measured. Further, it is known in solid-state NMR spectroscopy to rotate an NMR sample tilted at the so-called "magic angle" of approximately 54.74° in relation to the static magnetic field during the spectroscopic measurement ("MAS"=Magic Angle Spinning) in order to minimize line broadening on account of anisotropic interactions. To this end, the sample is inserted into a MAS rotor. MAS rotors are cylindrical tubes which are sealed with one or two caps, the upper one being provided with blade elements ("impeller"). The MAS rotor is arranged in an MAS stator and the MAS rotor is driven for the purposes of the rotation by gas pressure by way of the blade elements. The totality of MAS rotor and MAS stator is referred to as MAS turbine.

The MAS turbine is arranged in an NMR-MAS probehead during the NMR measurement. The probehead comprises a cylindrical shielding tube. Housed therein are RF electronic components, in particular RF coils, and the MAS turbine. With the shielding tube thereof, the probehead is typically inserted from below into the vertical room temperature bore of a superconducting magnet, positioned therein and held therein with hooks, supports, screws or the like. The MAS turbine is then situated precisely in the magnetic center of the magnet.

In addition to solid-state NMR, use may also be made of the dynamic transfer of spin polarization (DNP=dynamic nuclear polarization) technique. The DNP technique requires simultaneous irradiation of a magnetic microwave field at a frequency which is higher than the Larmor frequency of the 1H nuclei by a factor of approximately 660. Electron spins are excited by irradiation of a microwave field at a suitable frequency, whereupon a transfer of electron polarization onto the atomic nuclei of the sample may be brought about on account of spin interactions.

Currently, in the prior art, the microwave in DNP probeheads is irradiated by virtue of the port of a corrugated waveguide (double miter bend) being directed onto the MAS rotor. Although this approach is easy to implement from a technical point of view, only a fraction of the employed power is used. The reason for this lies in unwanted reflections, diffractions, etc. Moreover, in systems with rotor diameters of 1.3 mm (more accurately: just below 1.3 mm), an RF coil with a lower efficiency in comparison with non-DNP probeheads is used as it would otherwise hardly be transmissive in relation to microwaves.

In reference [1] cited at the outset, the predecessor project in relation to the present invention, the applicant developed an optimization which, inter alia, approximately doubles the microwave magnetic field in the DNP stator with a rotor bore of 3.2 mm with the aid of a lens and a mirror, reducing the power for the same field by a factor of 4.

If smaller MAS diameters are considered, it is easy to estimate that focusing on a smaller cross section should lead to significant field increases; the power savings lie at approximately a factor of 5 for a cross section of the MAS rotor of approximately 1.9 mm and approximately 20 for a rotor diameter of approximately 1.3 mm.

Specific Prior Art

Currently, in most systems according to the prior art, there usually is simple microwave irradiation into the MAS stator through a round hole in the coil block through the RF coil, optionally with suitable widening of the coil turns in the center without further measures. However, only a fraction of the power introduced reaches the alternating magnetic field at the sample location as a result thereof.

The journal article Cryogenic sample exchange NMR probe for magic angle spinning dynamic nuclear polarization, A. Barnes et al., Journal of Magnetic Resonance 198 (2009) 261-270 (=reference [2]) discloses a 4 mm probehead, the stator walls of which are metallized. However, it lacks a lens. Moreover, the problem of focusing on a small rotor does not arise in this case as the waveguide has similar dimensions to those of the rotor.

WO 2015/175507 A1 (=reference [3]) already describes an arrangement with some of the features, albeit not all of the features, defined at the outset. A plurality of irradiation methods are shown. In one variant (FIG. 4F therein), an RF coil with a gap is wound, with a curved mirror being situated behind the coil. A further coil is situated within the rotor, said further coil being coupled inductively and hence having a higher RF efficiency. Mirrors are also situated within the rotor. Even though a small RF coil is used in this case, the rotational speed is limited on account of the rotor diameter. FIG. 10A shows a variant with a Teflon lens at the waveguide output, forming a resonator together with an adjustable mirror. The field distribution shown in FIG. 10C implies that the known arrangement produces a tunable resonator. The adjustable mirror shown therein should tune a "cavity mode". Furthermore, FIG. 10C of the document shows that the wavelength approximately corresponds to twice the rotor diameter. For a 3.2 mm system, this means a vacuum wavelength of approximately 6 mm, and hence a frequency of 50 GHz. While such a strongly resonant structure has the advantage of high field amplitude, a fundamental disadvantage of such resonators consists in the usually high obtainable quality causing a very narrow frequency bandwidth, which reacts very sensitively to external or internal influences and hence requires very precise tuning.

US 2016/0334476 A1 (=reference [4]) shows a resonator for non-MAS-DNP applications, which is constructed within the RF coil and coupled by the waveguide via a dielectric. This resonator is constructed in such a way that it is transparent to RF radiation but opaque to microwaves. The microwave-relevant components in this known system are—at least to a large part—arranged within the RF coil. Therefore, the microwave efficiency is not particularly high.

EP 3 030 917 B1 (=reference [5]) shows a dielectric coupler, with which microwave power from the waveguide should be brought more effectively to the rotor. However, the influences of the RF coil on the microwave power are not taken into account.

US 2017/0074952 A1 (=reference [6]) relates to systems and methods for taking samples of fluids from oil and gas boreholes using nuclear magnetic resonance (at least it also relates to NMR). The line system contains integral coils for transmitting an NMR pulse sequence and for detecting NMR signals. The RF solenoid coil is wound onto a cylindrical carrier, optionally guided in a groove, and subsequently pushed into a second cylinder. As a result, the coil is separated from the sample in mechanically secured fashion, said sample passing by both on the inside and on the outside. The fill factor drops if an inner coil carrier is required. Therefore, as a rule, the sample positioning is restricted to the interior of the solenoid in the case of solid-state NMR and, in particular, in the case of MAS.

By contrast, reference [1], cited at the outset, already describes a complete generic arrangement having all of the features defined at the outset. Here, use is made of a lens and a mirror so as to modify the incident beam in such a way that the incidence on the rotor is always perpendicular. The thickness of the rotor wall and the turn spacing of the coil were likewise optimized therewith. However, the arrangement according to reference [1] is directed to improving the current 3.2 mm system, in particular. By contrast, there are only limited advantages in the case of smaller rotor diameters.

SUMMARY

Accordingly, one object of the present invention is to provide a coil block for an NMR-MAS probehead of the type defined at the outset, which facilitates a further substantial improvement in the efficiency of the microwave irradiation, i.e., the magnetic field strength per unit of incident power, particularly also in the case of smaller systems than the currently conventional 3.2 mm systems and, to be precise, ideally to such an extent that conventional, expensive microwave sources are replaceable by smaller, cheaper sources. At the same time, further objects of the present invention are to maintain the inductance of the RF coil and to improve the RF efficiency.

According to one formulation, these objects are achieved by an NMR-MAS probehead of the type set forth at the outset and by a coil block that is modified according to the invention, which are characterized in that the coil block is constructed from dielectric material, in that the coil block has such a geometric extent and is inserted into the wall of the MAS stator in such a way that it at least partly surrounds the RF coil and the MAS rotor, in that the coil block has a first bore that extends coaxially with the longitudinal axis of the elongate MAS rotor, the RF coil being fastened to the inner wall of said first bore, and in that the coil block has a second bore that extends coaxially with the longitudinal axis of the first hollow, elongate microwave guide and that comprises a hollow, elongate second microwave guide for supplying microwave radiation from the first microwave guide into the sample volume.

Preferably, the RF coil can also completely surround the MAS rotor. Fastening the RF coil to the inner wall of the first bore can be implemented in force-fit fashion, in interlocking fashion in a groove or else cohesively, for instance using adhesive. A force-fit connection is preferred.

The present invention provides a probehead for NMR-DNP-MAS spectroscopy, which facilitates an even better yield of the incident microwave power, particularly in the case of systems with rotor diameters of significantly less than 3.2 mm, too, by virtue of a plurality of components—each known per se—being combined according to the invention.

In theory, such an increase in the effectively effective microwave power would also be possible by virtue of a lens (as proposed in reference [1]) focusing the microwave beam coming from the first waveguide on the MAS rotor. However, practical implementations of this fail on account of the small dimensions of the stator in comparison with the output of the first waveguide. Either the MAS stator would have to be opened up for the focused beam, which cannot be combined with the MAS function, or the waveguide would have to be brought closer to the MAS rotor. However, the latter cannot be implemented with the existing diameter either, on account of the small height of a 1.3 mm stator. Therefore, a smaller second waveguide in the form of a metallic tube or a metallized bore is used according to the invention, these being introduced into the coil block and being responsible for guiding the microwave radiation within the MAS stator.

In the coil block, the waveguide ends at a sufficient distance in front of the RF coil so as to reduce disturbing influences from the NMR measurement. The backside of the coil block has a metallic coat or a metal film adhesively bonded thereon, and can already act as a mirror in this case. Simulations have shown that this can achieve an increase in the field efficiency of approximately 4, corresponding to power savings of $4^2=16$. By way of comparison: In the arrangement according to reference [1], the power saving was only approximately 3-4.

Further Advantages Over the Prior Art

A decisive advantage of the feature combination according to the invention also lies in the fact that this facilitates MAS coils for DNP, which have suitable dimensions for both microwave radiation and RF radiation. Conventionally, use is made of an unsupported RF coil (with caked lacquer) which, however, must then be wound tightly and made of thicker wire (~0.2 mm), else it lacks the necessary rigidity. If too many turns are chosen, the turns lie close to one another and microwaves are no longer transmitted. Therefore, a coil with many turns but nevertheless a spacing between said turns would be advantageous. However, the only way this can still be achieved is by way of a thin wire (~0.1 mm); naturally, the latter would no longer be sufficiently rigid for the RF coil. By contrast, the RF coil is held within a bore when the coil block that was modified according to the invention is used, as a result of which said RF coil is mechanically immobilized. By way of example, grooves in the coil block body, in which the conductor is securely adhesively bonded, can implement a fixation of the RF coil.

Finally, a further advantage of the present invention also lies in the fact that the available, ubiquitous MAS stator hardly needs modification and the additional parts only require very little material outlay, and so the teaching according to the invention can be implemented very cost-effectively. The changes prescribed by the teaching according to the invention are compactly unified in one component that can easily be replaced. A great advantage thereof is the simplicity, as the conventional MAS stator requires no changes at all. All that has to be done to reconfigure a conventional 1.3 mm probehead is replacing the coil block and introducing a lens into the waveguide output where necessary.

Further Embodiments and Developments of the Invention

In particularly preferred embodiments of the MAS-NMR probehead according to the invention, the first bore of the coil block is dimensioned so as to receive an MAS rotor with a diameter of less than 2 mm, preferably a diameter of 0.4 mm to 1.9 mm, in particular a diameter of approximately 1.3 mm. The small dimensions of such small rotors allow a significant increase in the efficiency since the input cross section of the first waveguide remains constant.

Furthermore, embodiments of the invention, in which the first microwave guide, in particular in view of its diameter and its form, has such a geometric structure that it focuses the microwave radiation guided therethrough onto the opening, facing it, of the second microwave guide in the coil block, are found to be particularly useful. This can ensure that the microwave power is guided onto the sample volume in concentrated fashion.

A class of alternative embodiments thereto, in which a microwave lens for focusing the supplied microwave radiation onto the lens-side opening of the second microwave guide is arranged between the first microwave guide and the coil block, preferably at the coil-block-side free end of the first microwave guide, was found to be particularly advantageous. As a result, an even greater component of the available microwave power is coupled from the first waveguide into the second waveguide.

Developments of this class of embodiments of the NMR-MAS probehead according to the invention, which are distinguished by virtue of the microwave lens being arranged on the side facing the sample volume and being geometrically embodied in respect of its focal length in such a way that the lens-side opening of the second microwave guide lies at the focus of the microwave lens, are particularly preferred. As a result, a maximal component of the available microwave power is coupled from the first waveguide into the second waveguide.

In practice, the microwave lens is constructed from a dielectric material, preferably PTFE, possibly also sapphire and/or silicon and/or boron nitride in specific applications, in preferred developments of the above-defined class of embodiments. These materials cause only low losses (tan d≤0.001) and a high refractive power, even for thin lenses.

An antireflection coating, preferably made of plastic, in particular of PTFE or Vespel, or made of a sub-wavelength structure, can be applied to the outer surfaces of the microwave lens. Such an antireflection coating maximizes the transmission of the incident beam through the lens.

As seen in the beam direction of the microwave radiation emerging from the second microwave guide in the direction of the sample volume, the microwave lens can have a convex-plane embodiment and, in particular, have a thickness of between 1 mm and 5 mm, preferably approximately 4 mm, on its center axis. Additionally, the microwave lens will have at least one spherical or cylindrical face in practice, in particular with a radius of curvature of between 3 mm and 10 mm, preferably approximately 4 mm.

Instead of a lens at the output of the first waveguide, there can also be a reduction in the cross section toward the output of the first waveguide (a so-called "taper") in order to efficiently transfer the microwave beam into the second waveguide.

In a further class of advantageous embodiments of the NMR-MAS probehead according to the invention, a microwave mirror for reflecting the microwave radiation that emerges from the second microwave guide and passes through the sample volume is present on the inner side of the MAS stator that lies opposite the second microwave guide in respect of the MAS rotor. The microwave reemerging from the sample volume and MAS rotor is once again reflected onto the sample volume, as a result of which an even higher component thereof can be used.

As a rule, the microwave mirror will comprise a metallic or metallized layer, in particular a sheet of Ag, Au or Cu, which preferably has a thickness of between 0.1 µm and 100 µm, preferably approximately 1 µm. A thin sheet made of the aforementioned materials minimizes the static and RF field distortion while the microwave radiation is completely reflected on account of the low skin depth. Alternatively, the microwave mirror can comprise one or more dielectric layers.

Particularly preferred developments in the aforementioned class of embodiments are distinguished by virtue of the microwave mirror being attached to the coil block or spatially integrated into the coil block. This yields a compact structure and the mirror need not be attached separately, for instance on the MAS stator. Moreover, the application on the outside on the coil block is easier than on the inside on the MAS stator.

Other developments are characterized in that the microwave mirror is constructed to be cylindrical or spherical and concave in the direction of the sample volume and in that the microwave mirror has such a structural configuration that it focuses onto the longitudinal axis of the MAS rotor the microwave radiation that comes from the sample volume and that is incident thereon. As a result, the aforementioned advantages of this class of embodiments are increased even further, in particular in the direction of an even higher effectiveness when exploiting the irradiated microwave power.

In a further class of preferred embodiments of the NMR-MAS probehead according to the invention, the RF coil is a single-layer solenoid coil constructed from a plurality of spaced apart turns, the winding thickness d and turn spacing D of which are optimized in such a way that at least 80% of the microwave radiation is transmitted through the RF coil. Then, the coil no longer represents an obstacle to the microwave radiation. This is because, otherwise, a large part of the introduced power would be reflected back again before it reaches into the sample volume.

The advantages according to the invention can be particularly exploited in developments of this class of embodiments in which the ratio of d to D is less than or equal to 0.5 and the ratio of D to the wavelength of the microwave radiation in vacuo is greater than 0.2.

In general, a compromise between, firstly, the inductance of the RF coil, which correlates with the number of turns and which should be optimized for the employed RF range, and, secondly, the microwave transparency of the RF coil, which requires a minimum distance between the turns, is required in the case of MAS coils for DNP applications. The inductance should be increased toward low frequencies, while the turn spacing must be increased in order to ensure adequate incoming microwave radiation. Since the coil length is predetermined here by the turbine geometry, this leads to contradictory requirements.

Expedient parameters for the RF coil are present in the following value ranges: In practice, the RF coil will have between 6 and 12 turns, a winding thickness of 0.05 mm≤d≤0.30 mm, a coil length of approximately 2.5 mm and a pitch of the turns of between 0.1 mm and 1.0 mm. These are typical dimensions for 1.3 mm systems which lead, firstly, to a transparent coil in the microwave range but, secondly, also to an efficient coil in the RF range. According to lattice theory (strictly speaking, this only applies to planar lattices and not to wound lattices such as coils), the transmission then still is >67% in the case of a correspondingly expedient polarization of the incident wave.

Additionally, the RF coil should be constructed from a magnetically compensated wire or Cu and/or Ag and/or Al or the alloys thereof, as a result of which a field distortion of the static magnetic field is largely reduced.

Preferably, there is a distance of 0.5 mm to 3 mm between the coil-facing end of the second microwave guide and the RF coil. Hence, the waveguide leads the microwave radiation sufficiently close to the sample volume such that good coupling occurs. However, the distance at the same time suffices to avoid electrical breakdown or field distortions of the B1 field.

The scope of the present invention also includes a coil block for use in an NMR-MAS probehead of the above-described type according to the invention, wherein the NMR-MAS probehead comprises an MAS stator for receiving an elongate MAS rotor with a sample substance in a sample volume and a hollow, elongate first microwave guide for supplying microwave radiation into the sample volume, and wherein the MAS rotor is surrounded by an RF coil. According to the invention, the coil block is characterized in that it is constructed from an electrically nonconductive dielectric material, in that it has such a geometric extent and can be inserted into the wall of the MAS stator in such a way that it at least partly surrounds, preferably completely surrounds, the RF coil and the MAS rotor of the NMR-MAS probehead in the operational state of the latter, in that it has a first bore that extends coaxially with the longitudinal axis of the MAS rotor in the operational state of the NMR-MAS probehead, the RF coil being fastened to the inner wall of said bore, and in that it has a second bore that extends coaxially with the longitudinal axis of the first microwave guide in the operational state of the NMR-MAS probehead and comprises a hollow, elongate second microwave guide. In this way, the modifications in relation to the prior art are compactly unified in a component that can easily replace a conventional component in exchange.

Preferably, the coil block according to the invention is constructed from a dielectric material that has high mechanical rigidity, produces no unwanted signals during NMR operation (as would be the case for polymers, for instance) and allows no expansion or shrinkage in relation to the MAS stator (BN, approximately $3 \times 10^{-6}$ $K^{-1}$) over a broad temperature range, preferably made of ceramic, sapphire or quartz glass. These are nonmagnetic, nonconductive, mechanically stable materials with sufficient transmittance and low damping for the microwave radiation.

The advantages of the present invention take effect in a particularly expedient manner in developments in which, in the coil block according to the invention, the internal diameter of the second microwave guide is smaller than the internal diameter of the first microwave guide, preferably by at least 50%. The invention works better when focusing on a smaller rotor cross section. Indirectly, this also yields the dimensions of the second waveguide. The lower bound is provided by the wavelength: a cutoff arises if the diameter is too small in comparison therewith.

Developments prefer for the backside of the coil block that lies opposite the second microwave guide in respect of the RF coil to have such metallic coating or to be provided with a metal film such that it acts as a microwave mirror. This yields a particularly compact structure. There is no need for the mirror to be attached separately, for example on the MAS stator. Moreover, the application from the outside on the coil block is easier than on the inside on the MAS stator. The microwave radiation reemerging from the sample volume and the MAS rotor is reflected onto the sample volume again, as a result of which a greater component thereof can be used.

Developments of the coil block according to the invention in which the second bore has a metallic coating on its inner wall and thus acts as a second microwave guide that is integrated into the coil block have particularly proven their worth in practice. This approach requires less material strength and may be advantageous if one is close to the cutoff dimension. Moreover, fewer disturbances of the static magnetic field are thus potentially expected since significantly less metal is brought into the vicinity of the sample. The second microwave guide can advantageously be embodied with corrugations. This would better maintain the HE11 mode.

Other preferred developments of the coil block according to the invention are characterized in that the second bore has a metallic coating on its inner wall and thus acts as a second microwave guide that is integrated into the coil block.

The inner wall of the first bore can have corrugations or a groove structure, on which the RF coil is fastened in force-fit and/or interlocking fashion. Adhesive bonding of the RF coil is also possible. As a result, better control over the turn spacing is obtained. Moreover, this allows a realization of RF coils with the variable turn spacing.

Finally, the end of the tubular second microwave guide facing away from the coil can have a widening, in particular a trumpet-like widening, in developments of the coil block according to the invention; this may be advantageous in specific applications.

Further advantages of the invention emerge from the description and the drawing. Likewise, the features mentioned above and the features yet to be listed below can find use according to the invention, in each case individually on their own or together in any combination. The shown and described embodiments should not be understood to be a comprehensive list; instead, they are of exemplary nature for the purposes of explaining the invention.

BRIEF DESCRIPTION OF THE DRAWINGS

The invention is illustrated in the drawing and will be explained in more detail on the basis of exemplary embodiments.

In the drawing.

DETAILED DESCRIPTION

Figure 1:
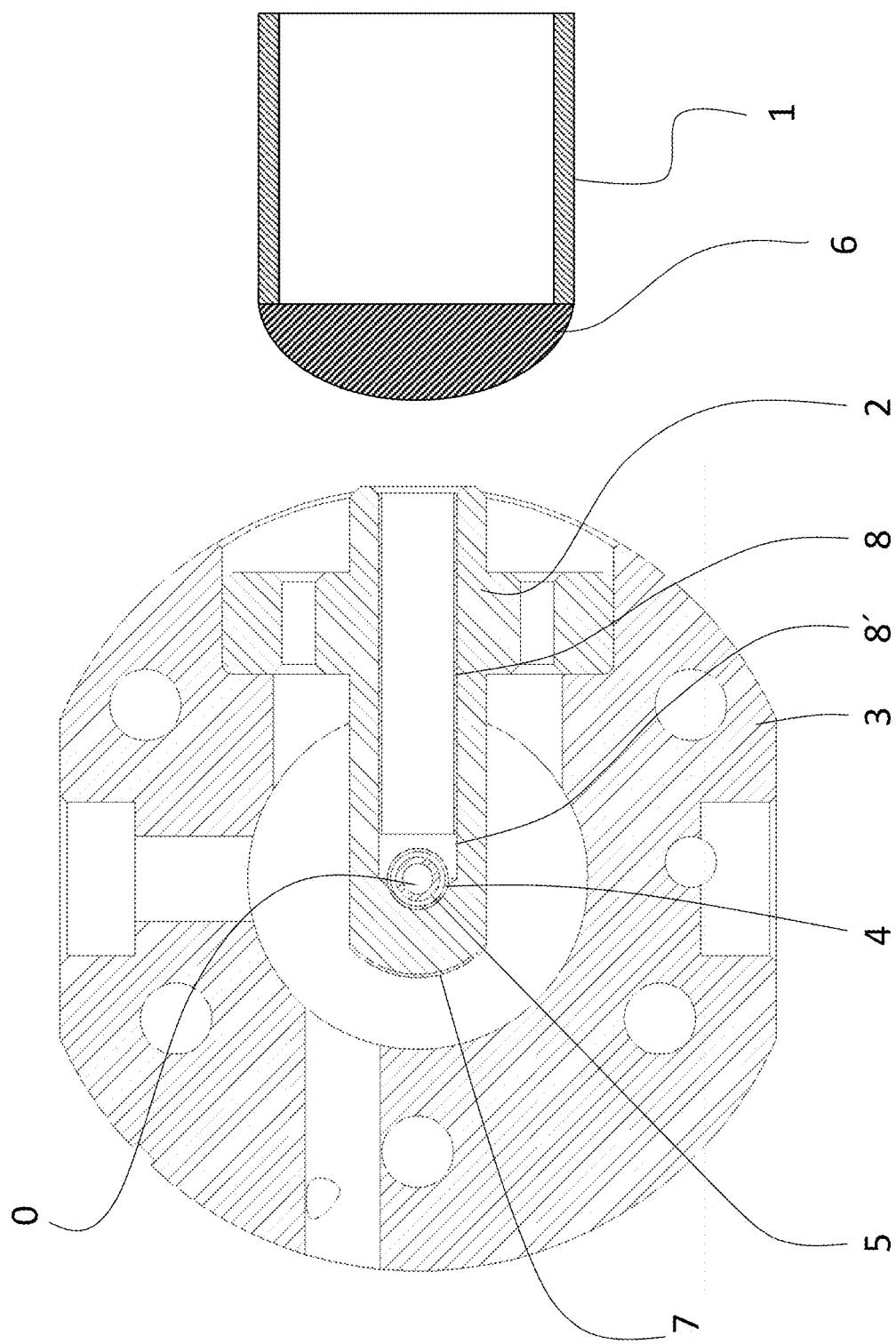
FIG. 1 shows a schematic cross-sectional illustration of a first embodiment of the NMR-MAS probehead according to the invention.
Figure 2:
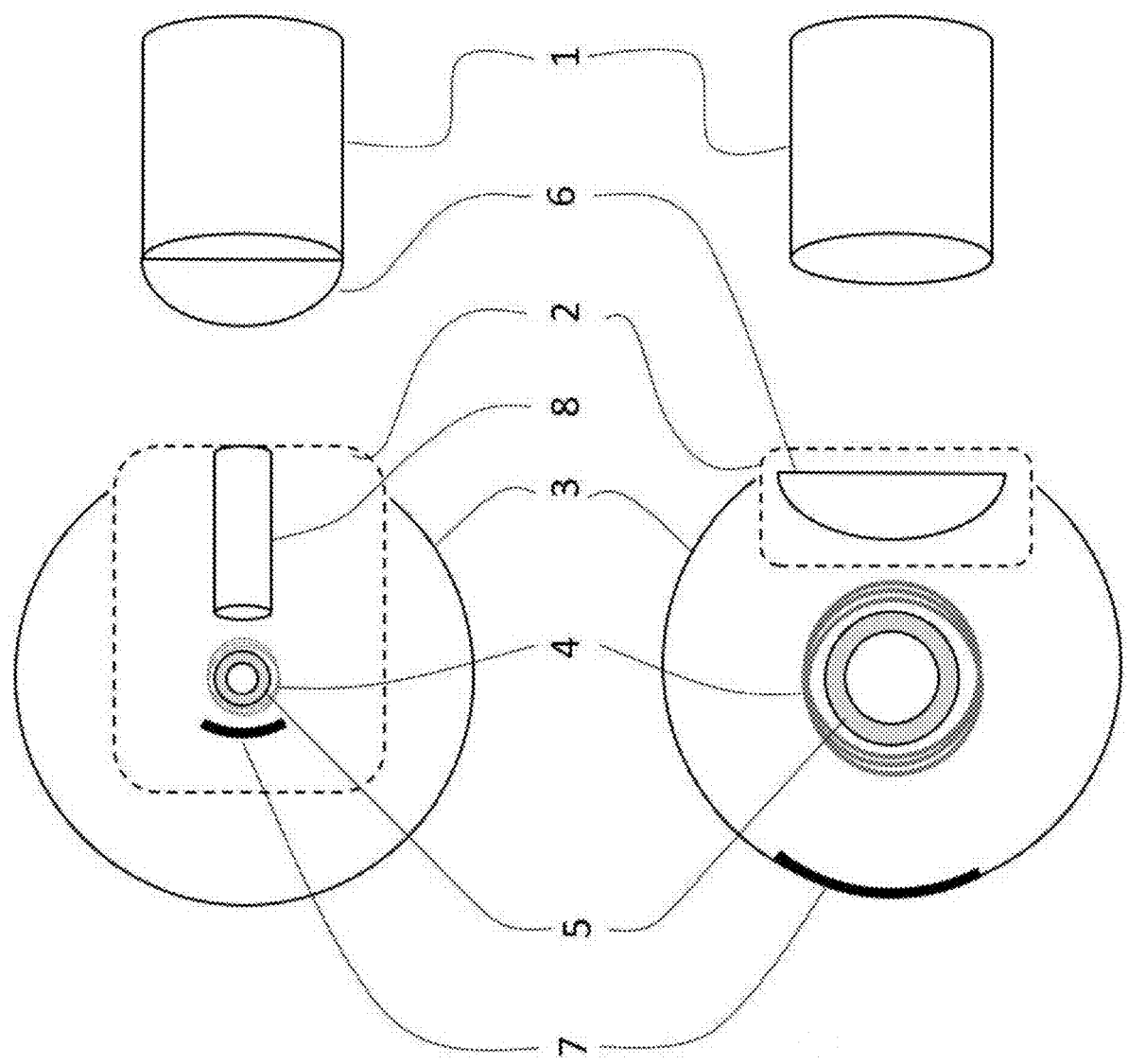
FIG. 2A shows a schematic cross-sectional illustration of an NMR-MAS probehead according to the invention, with a coil block carrying the RF coil in a bore and a second microwave guide.
FIG. 2B shows a schematic cross-sectional illustration of an NMR-MAS probehead according to the closest prior art as per reference [1] with a plano-convex microwave lens and a flat microwave mirror.

The invention relates to a novel configuration of a coil block for a MAS-DNP-NMR probehead, the main application of which being as a constituent part of a magnetic resonance apparatus. The embodiments of the probehead according to the invention, as illustrated in FIGS. 1 and 2A, for instance, each comprise an NMR-MAS probehead with an MAS stator 3 for receiving an elongate MAS rotor 5 that is surrounded by an RF coil 4, said MAS rotor having a sample substance in a sample volume 0, and having a hollow, elongate first microwave guide 1 for supplying microwave radiation into the sample volume 0 through a coil block 2 introduced in a wall of the MAS stator 3.

The arrangement according to the invention is distinguished by virtue of the coil block 2 being constructed from dielectric material, the coil block 2 having such a geometric extent and being inserted into the wall of the MAS stator 3 in such a way that it at least partly surrounds the RF coil 4 and the MAS rotor 5, the coil block 2 having a first bore 4' that extends coaxially with the longitudinal axis of the elongate MAS rotor 5, the RF coil 4 being fastened to the inner wall of said first bore, and the coil block 2 having a second bore 8' that extends coaxially with the longitudinal axis of the first hollow, elongate microwave guide 1 and that comprises a hollow, elongate second microwave guide 8 for supplying microwave radiation from the first microwave guide 1 into the sample volume 0.

The internal diameter of the second microwave guide 8 is smaller than the internal diameter of the first microwave guide 1, preferably by at least 50%.

The second bore 8' can have a metallic coat on its inner wall and thereby act as a second microwave guide 8 that is integrated into the coil block 2.

The inner wall of the first bore 4' can have corrugations or a groove structure on which the RF coil 4 is fastened in force-fit and/or interlocking fashion.

Figure 4:
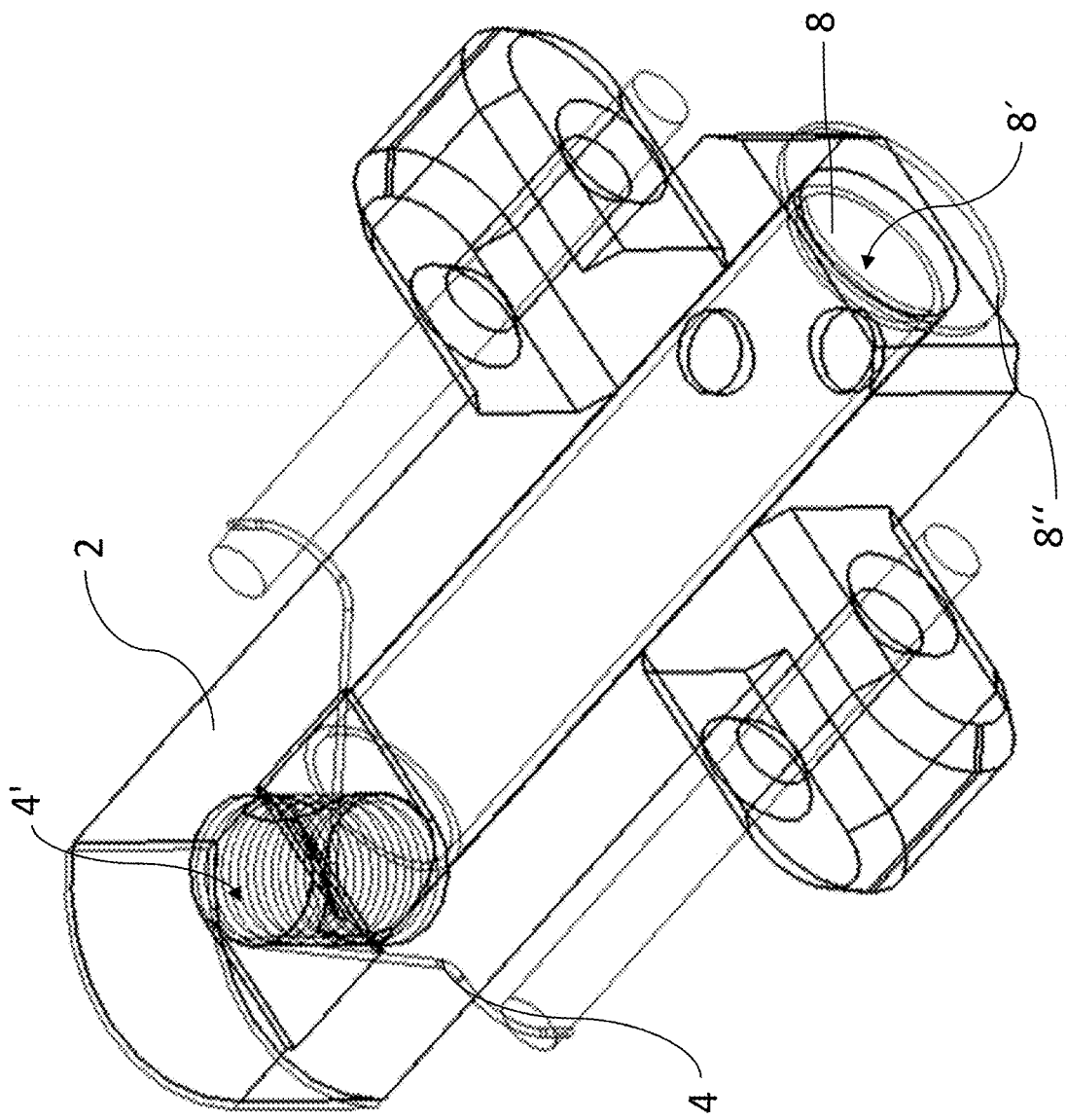
FIG. 4 shows a schematic 3D CAD view of a coil block that has been modified according to the invention.

Additionally, the end of the tubular second microwave guide 8 distant from the coil can have a widening 8", in particular a trumpet-like widening, as may be identified in FIG. 4.

In embodiments of the invention, the first microwave guide 1, in particular in view of its diameter and its form, can have such a geometric structure that it focuses the microwave radiation guided therethrough onto the opening, facing it, of the second microwave guide 8 in the coil block 2.

Figure 6:
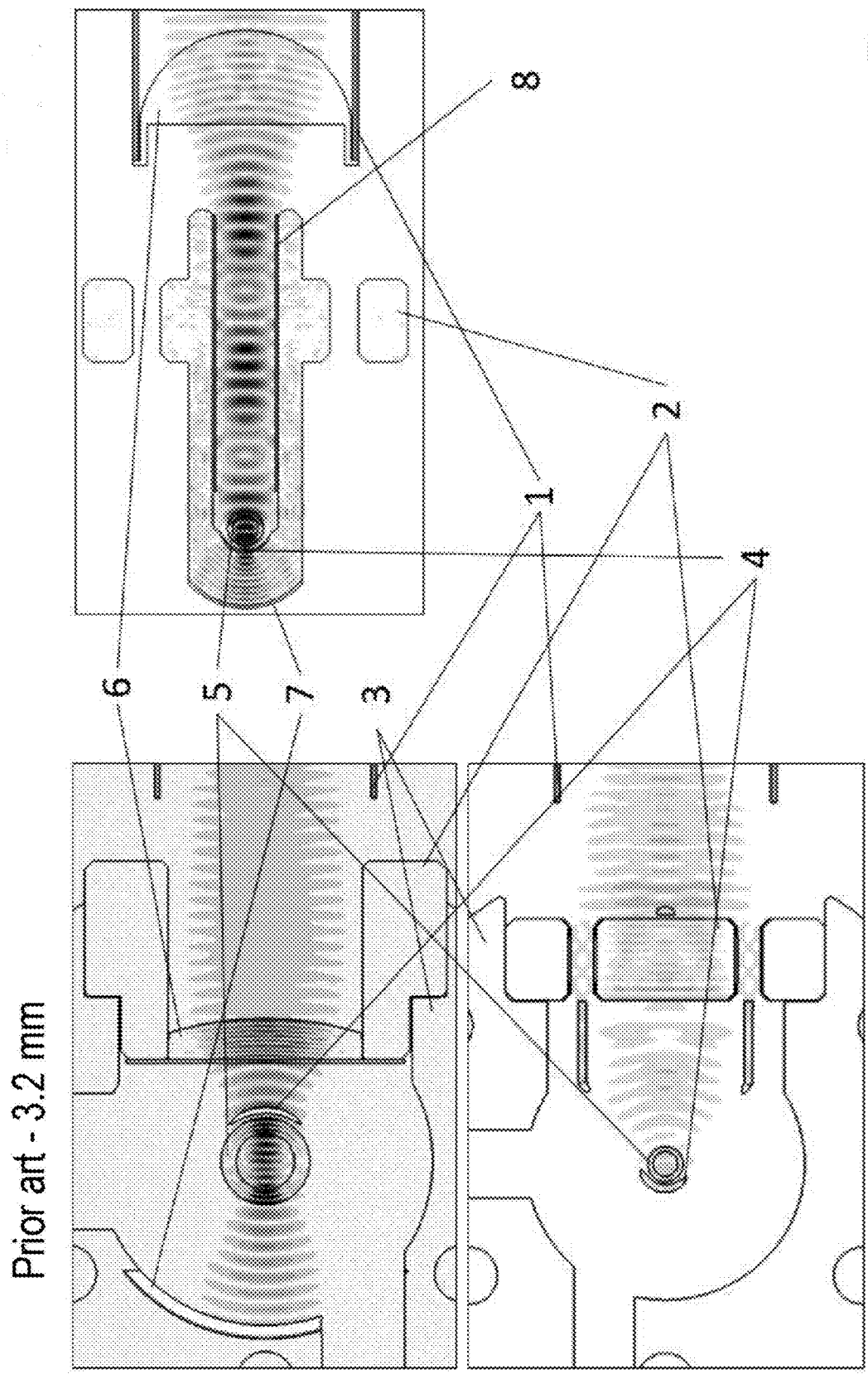
FIG. 6 shows a central cut through the H-field amplitude distribution of a 3D EM simulation in the case of two arrangements according to the prior art (left) and an arrangement according to the invention (top right), wherein the scaling of the field values was chosen to be the same.

In the embodiments of the invention illustrated in FIGS. 1, 2A and 6, which are an alternative thereto, a microwave lens 6 for focusing the supplied microwave radiation onto the lens-side opening of the second microwave guide 8 is arranged between the first microwave guide 1 and the coil block 2 at the coil-block-side free end of the first microwave guide 1. This microwave lens 6 is arranged and geometrically embodied in respect of its focal length on the side facing the sample volume 0 in such a way that the lens-side opening of the second microwave guide 8 lies in the focus of the microwave lens 6.

Moreover, in the embodiments of FIGS. 1, 2A and 6, it is possible to identify that a microwave mirror 7 for reflecting the microwave radiation that emerges from the second microwave guide 8 and passes through the sample volume 0 is present on the inner side of the MAS stator 3 that lies opposite the second microwave guide 8 in respect of the MAS rotor 5. This microwave mirror 7 can be attached to the coil block 2 or spatially integrated into the coil block 2. It can be constructed to be cylindrical and concave in the direction of the sample volume 0 and can have such a structural configuration that it focuses the microwave radiation that comes from the sample volume 0 and that is incident thereon onto the longitudinal axis of the MAS rotor 5.

The backside of the coil block 2 that lies opposite the second microwave guide 8 in respect of the RF coil 4 can have such metallic coating or can be provided with a metal film in such a way that it acts as a microwave mirror 7.

While FIG. 1 shows many details of the NMR-MAS probehead according to the invention and of the coil block 2 that was modified according to the invention in a schematic sectional illustration through a horizontal plane, FIG. 2A, in an even more schematic drawing of the principles, elucidates the arrangement according to the invention in a direct comparison with the arrangement, illustrated in FIG. 2B, according to the closest prior art as per reference [1]. The significant differences in the structure and configuration of the respective coil block 2 require no further comments. FIGS. 2A and 2B also show the observer that the principal applications of the present invention lie predominantly in systems with smaller external diameters of the MAS rotor 5 than in the conventional prior art.

Figure 3:
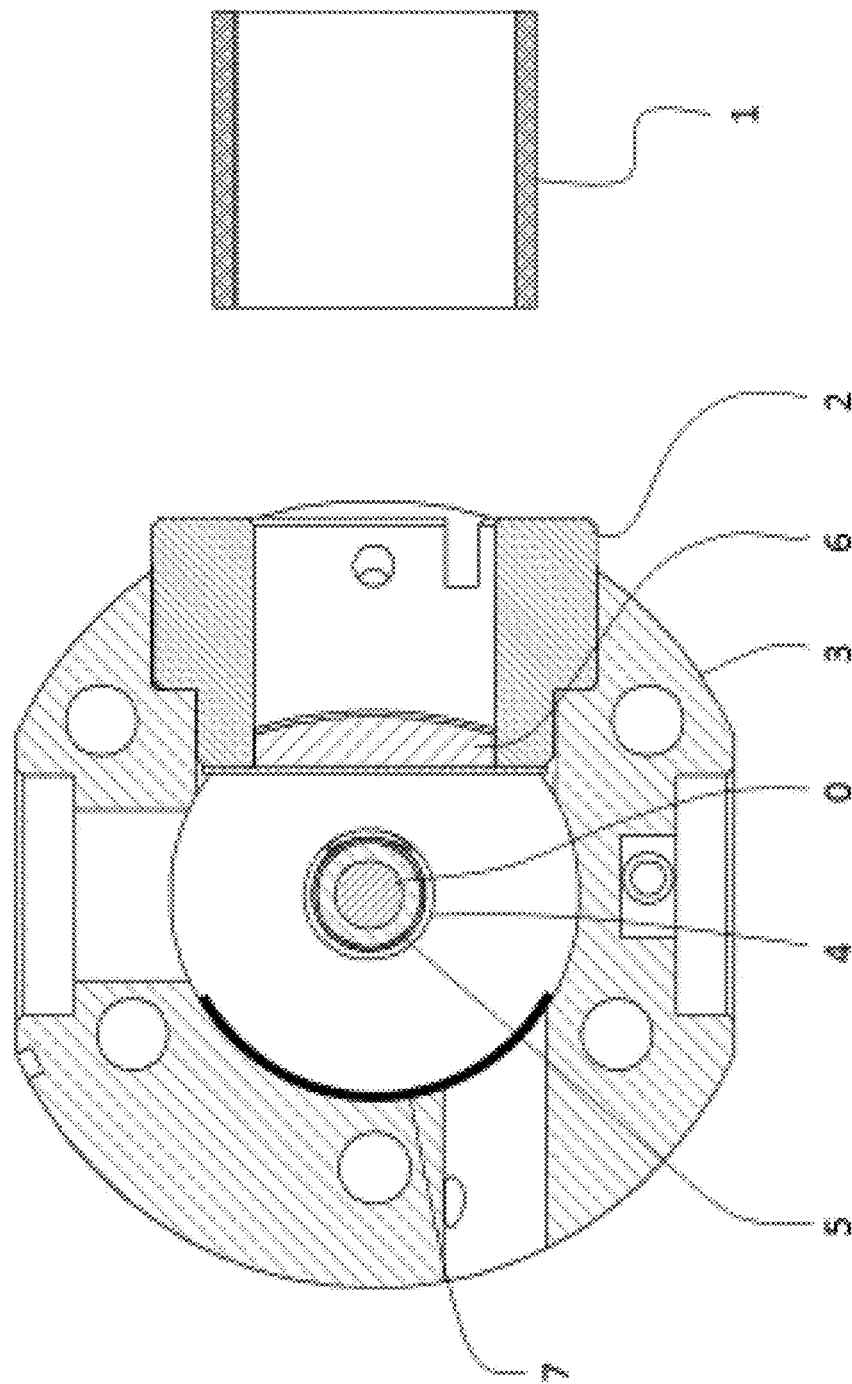
FIG. 3 shows a schematic cross-sectional illustration of an NMR-MAS probehead according to the prior art as per reference [1] in comparison with the invention according to FIG. 1.

FIG. 3 illustrates—as a counterpart to the illustration of the invention in FIG. 1—an NMR-MAS probehead with a coil block according to the prior art, as described in reference [1]. This closest prior art likewise makes use of a lens and a mirror, however precisely not with the above-described modifications according to the invention, as becomes clear, in particular, from the significantly different structure and positioning of the coil block and, in particular, the complete lack of the second microwave guide integrated into the coil block.

The notable modifications of the coil block 2 according to the invention can be identified in concentrated form in the partly transparent spatial illustration of FIG. 4:

What is noteworthy to the present invention is a structure of the coil block 2—naturally not displayable in the drawing—made of an electrically nonconductive dielectric material and its geometric arrangement within the MAS stator 3 in such a way that the coil block 2 receives the RF coil 4 in its first bore 4' and hence also surrounds the MAS rotor 5. Here, the RF coil 4 is fastened on the inner wall of the first bore 4' in interlocking and/or force-fit fashion. What is also significant to the invention is the hollow, elongate second microwave guide 8 that is arranged in the second bore 8' of the coil block 2.

Figure 5:
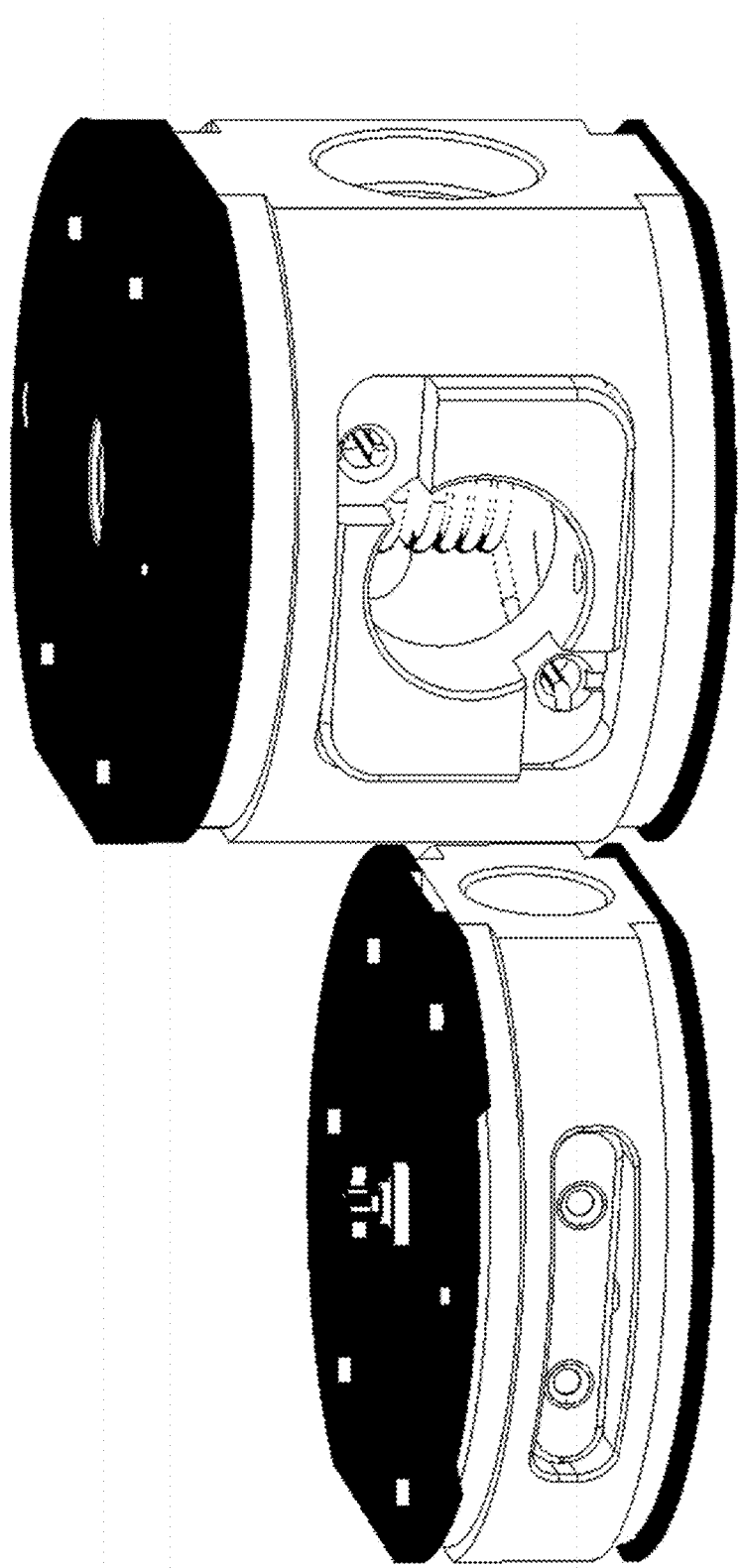
FIG. 5 shows a size comparison between a 1.3 mm MAS stator (left) and a 3.2 mm MAS stator (right)

FIG. 5 contrasts a 1.3 mm MAS stator (left) with a conventional 3.2 mm MAS stator (right) in a direct size comparison. It is possible to clearly identify the difficulties—already purely geometrical difficulties—that occur in relation to the microwave access to the sample volume in the arrangement with the smaller MAS rotors. Until now, the latter have prevented a more efficient use of the radiated-in microwave power; this can now be decisively improved by the present invention.

FIG. 6 illustrates a 3D EM simulation of the H-field amplitude in a horizontal sectional plane in an arrangement according to the closest prior art as per reference [1] in a 3.2 mm embodiment (top left), according to further prior art in a 1.3 mm embodiment (bottom left) and in an arrangement according to the invention (top right). Using this, the technical advance on account of the present invention is clearly elucidated:

Previous Prior Art (Bottom Left):

The Gaussian beam comes from the right and strikes coil and rotor; although the illumination is quite good, the beam is reflected and diffracted in uncontrolled fashion after the first strike, as a result of which a significant fraction is lost.

Closest Prior Art (Top Left):

The Gaussian beam comes from the right, strikes the cylindrical lens and is focused in a direction such that it strikes the rotor virtually perpendicularly. As a result, the rotor wall can be adapted in uniform manner since the rotor then acts not like a curved surface but like a plane dielectric. The coil transmits the beam in largely unimpeded fashion such that the latter is reflected at the cylindrical mirror and passes through the sample again. As a result of the two-fold passage, the power received by the sample increases.

Invention (Top Right):

On account of the second microwave guide 8 that, according to the invention, is arranged in the coil block 2 and on account of the positioning and dimensioning according to the invention of microwave lens 6 and microwave mirror 7, a once again significantly improved efficiency of the radiated-in microwave power is obtained, which, in particular, has a significant impact in the case of systems with MAS rotor diameters<<3.2 mm (here: 1.3 mm) in particular.

Figure 7:
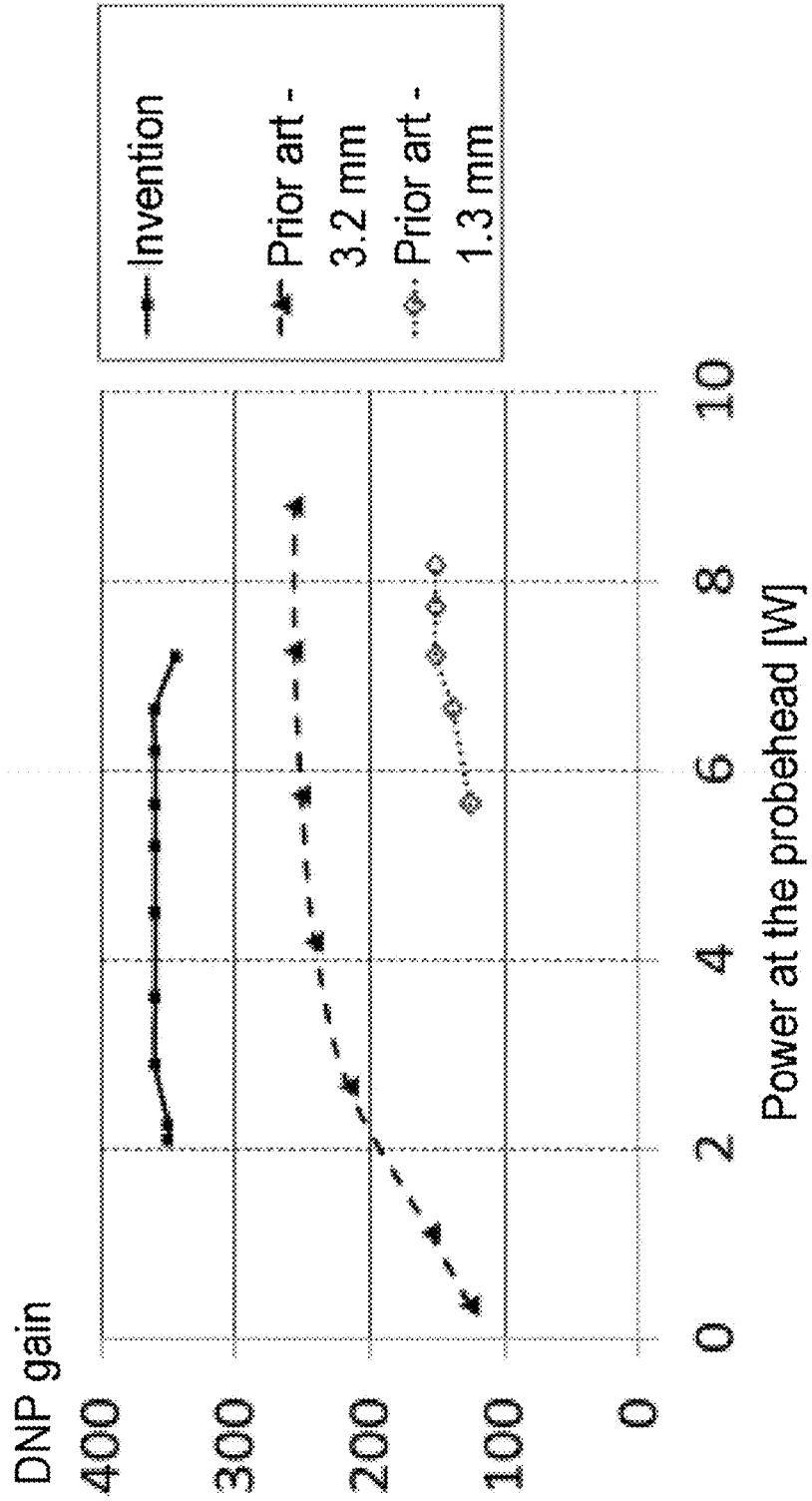
FIG. 7 shows a graphic with experimental results of the DNP gain by the arrangement according to the invention in comparison with arrangements according to the prior art.

Finally, the efficiency gain on account of the invention is illustrated graphically in FIG. 7 in exemplary fashion. Here, the DNP gain variable is plotted on the ordinate axis against the power on the probehead in watt, specified on the abscissa axis.

What can be gathered from the experimental data combined in FIG. 7 is how the coil block that was modified according to the invention behaves in respect of the polarization gain (DNP gain) as a function of the radiated-in microwave power. Here, what can clearly be identified is that the arrangement according to reference [1] (illustrated top left in FIG. 6) already improves the "DNP gain" in a 3.2 mm system. The corresponding central curve (black triangular symbols) in FIG. 7 already lies quite significantly over the lower curve (open diamond symbols), which shows the measurement results using a "conventional" arrangement (shown bottom left in FIG. 6) according to the older prior art in the case of a 1.3 mm system, with the teaching of reference [1] reaching practical limits on account of the geometric restrictions.

The arrangement according to reference [1] already leads to the same polarization effect already being obtained in the case of significantly lower microwave power than in an arrangement according to the older prior art. As a consequence, it is thus possible to resort to smaller and more cost-effective microwave sources. If the provided power is not restricted, a higher DNP gain may also be obtained therewith in saturation under certain circumstances.

Of course, the measurement values in an arrangement according to the invention (uppermost curve with black square symbols) once again lie far above the DNP gain values that are obtainable using the arrangement according to reference [1]. Additionally, what is moreover true here is that a 1.3 mm system that was modified according to the invention was used when measuring this uppermost curve, while the central curve was recorded using a 3.2 mm system.

LIST OF REFERENCE SIGNS

0 Sample volume
1 First microwave guide
2 Coil block
3 MAS stator
4 RF coil
4' First bore
5 MAS rotor
6 Microwave lens
7 Microwave mirror
8 Second microwave guide
8' Second bore
8" Trumpet-like widening

CITATIONS

Publications considered for assessing the patentability:
[1] DE 10 2016 207 998 B3
[2] Cryogenic sample exchange NMR probe for magic angle spinning dynamic nuclear polarization, A. Barnes et al., Journal of Magnetic Resonance 198 (2009) 261-270
[3] WO 2015/175507 A1
[4] US 2016/0334476 A1
[5] EP 3 030 917 B1
[6] US 2017/0074952 A1

What is claimed is:

1. A Nuclear Magnetic Resonance Magic Angle Spinning (NMR-MAS) probehead comprising:
   an MAS stator configured to receive an elongate MAS rotor that is surrounded by an RF coil, wherein the MAS rotor is configured to hold a sample substance in a sample volume, and
   a hollow, elongate first microwave guide configured to supply microwave radiation into the sample volume through a coil block introduced in a wall of the MAS stator,
   wherein the coil block is constructed from dielectric material,
   wherein the coil block has a given geometric extent and is inserted into the wall of the MAS stator to at least partly surround the RF coil and the MAS rotor, and
   wherein the coil block comprises:
      a first bore that extends coaxially with a longitudinal axis of the elongate MAS rotor, wherein the RF coil is fastened to an inner wall of the first bore, and
      a second bore that extends coaxially with the longitudinal axis of the first hollow, elongate microwave guide and that comprises a hollow, elongate second microwave guide configured to supply microwave radiation from the first microwave guide into the sample volume.

2. The NMR-MAS probehead as claimed in claim 1, wherein the first bore of the coil block is dimensioned to receive the MAS rotor with a diameter of less than 2 mm.

3. The NMR-MAS probehead as claimed in claim 2, wherein the first bore of the coil block is dimensioned to receive the MAS rotor with a diameter of 0.4 mm to 1.9 mm.

4. The NMR-MAS probehead as claimed in claim 1, wherein the first microwave guide has a geometric structure that focuses the microwave radiation guided therethrough onto an opening, facing the microwave guide, of the second microwave guide in the coil block.

5. The NMR-MAS probehead as claimed in claim 4, wherein the first microwave guide, on a side facing the sample volume, has a reduction in cross section for focusing the microwave radiation.

6. The NMR-MAS probehead as claimed in claim 4, further comprising a microwave lens configured to focus supplied microwave radiation onto a lens-side opening of the second microwave guide and arranged between the first microwave guide and the coil block.

7. The NMR-MAS probehead as claimed in claim 6, wherein the microwave lens is arranged at a coil-block-side free end of the first microwave guide.

8. The NMR-MAS probehead as claimed in claim 1, further comprising a microwave mirror configured to reflect microwave radiation that emerges from the second microwave guide and passes through the sample volume and arranged on an inner side of the MAS stator that lies opposite the second microwave guide with respect to the MAS rotor.

9. The NMR-MAS probehead as claimed in claim 8, wherein the microwave mirror is attached to the coil block or is spatially integrated into the coil block.

10. The NMR-MAS probehead as claimed in claim 8, wherein the microwave mirror is cylindrical and concave in a direction of the sample volume, and wherein the microwave mirror is configured to focus microwave radiation from the sample volume that is incident on the microwave mirror onto the longitudinal axis of the MAS rotor.

11. The NMR-MAS probehead as claimed in claim 1, wherein the RF coil is a single-layer solenoid coil constructed from a plurality of spaced apart turns, and wherein a winding thickness d and a turn spacing D of the solenoid coil are optimized so that at least 80% of the microwave radiation is transmitted through the RF coil.

12. The NMR-MAS probehead as claimed in claim 11, wherein the RF coil has a winding thickness of 0.05 mm ≤d ≤0.30 mm and a pitch of the turns of between 0.1 mm and 1.0 mm.

13. A coil block configured for a Nuclear Magnetic Resonance Magic Angle Spinning (NMR-MAS) probehead, wherein the NMR-MAS probehead comprises an MAS stator configured to receive an elongate MAS rotor configured to hold a sample substance in a sample volume and a hollow, elongate first microwave guide configured to supply microwave radiation into the sample volume, and
  wherein the MAS rotor is surrounded by an RF coil,
  wherein the coil block is constructed from an electrically nonconductive dielectric material,
  wherein the coil block is configured to be inserted into the wall of the MAS stator to at least partly surround the RF coil and the MAS rotor of the NMR-MAS probehead in an operational state of the NMR-MAS probehead, and
  wherein the coil block comprises:
    a first bore that extends coaxially with a longitudinal axis of the MAS rotor in the operational state of the NMR-MAS probehead, the RF coil being fastened to an inner wall of said the first bore, and
    a second bore that extends coaxially with the longitudinal axis of the first microwave guide in the operational state of the NMR-MAS probehead and comprises a hollow, elongate second microwave guide.

14. The coil block as claimed in claim 13, wherein an internal diameter of the second microwave guide is smaller than an internal diameter of the first microwave guide.

15. The coil block as claimed in claim 14, wherein the internal diameter of the second microwave guide is smaller than the internal diameter of the first microwave guide by at least 50%.

16. The coil block as claimed in claim 13, wherein a backside of the coil block that lies opposite the second microwave guide with respect to the RF coil has a metallic coating or has a metal film that the backside acts as a microwave mirror.

17. The coil block as claimed in claim 13, wherein the second bore has an inner wall metallic coating that acts as the second microwave guide integrated into the coil block.

18. The coil block as claimed in claim 13, wherein the inner wall of the first bore has a corrugation or groove structure, on which the RF coil is fastened in a force-fit and/or an interlocking fashion.

* * * * *